United States Patent [19]
Berkely et al.

[11] Patent Number: 6,031,729
[45] Date of Patent: Feb. 29, 2000

[54] INTEGRAL HEATER FOR REWORKING MCMS AND OTHER SEMICONDUCTOR COMPONENTS

[75] Inventors: Ryan S. Berkely, Long Beach; Mary C. Massey, Manhattan Beach; William E. McMullen, III, Redondo Beach; Steven F. VanLiew, El Segundo, all of Calif.

[73] Assignee: TRW Inc., Redondo Beach, Calif.

[21] Appl. No.: 09/227,249

[22] Filed: Jan. 8, 1999

[51] Int. Cl.⁷ ...................................... H05B 3/18
[52] U.S. Cl. ................ 361/771; 361/767; 257/700; 257/701; 257/723; 257/778; 29/611; 29/618; 29/620; 29/830; 219/209
[58] Field of Search .............. 29/611, 618, 620, 29/830; 174/260, 261, 262, 263, 268; 219/200, 201, 209, 210; 228/179.1, 180.1, 180.21, 180.22, 187, 191, 227; 257/700, 701, 723, 724, 737, 738, 767, 772, 778; 361/760, 767, 771, 777, 780, 782, 792–795, 805, 811; 439/83, 68

[56] References Cited

U.S. PATENT DOCUMENTS

| | | | |
|---|---|---|---|
| 3,289,046 | 11/1966 | Carr | 29/830 |
| 4,506,139 | 3/1985 | Daughton | 219/209 |
| 4,769,525 | 9/1988 | Leatham | 219/209 |
| 4,908,696 | 3/1990 | Ishihara et al. | 257/738 |
| 5,010,233 | 4/1991 | Henschen et al. | 219/209 |
| 5,624,750 | 4/1997 | Martinez | 428/344 |
| 5,700,987 | 12/1997 | Basavanhally | 219/209 |

Primary Examiner—Leo P. Picard
Assistant Examiner—John B. Vigushin
Attorney, Agent, or Firm—Michael S. Yatsko; Ronald M. Goldman

[57] ABSTRACT

A multi-chip module or other electronic semiconductor component (1) contains a multi-layer substrate (9) whose bottom surface, the bottom of the bottom layer (15) of that substrate, serves as the bonding surface for bonding the multi-chip module or component to a printed wiring board (8) using a thermally sensitive adhesive, such as a thermally sensitive adhesive or solder. The bottom layer (15) of that multi-layer substrate integrally includes a plurality of electrical heaters (16–28), arranged side by side. When energized with appropriate current, the heater generates sufficient heat to weaken the adhesive bond, allowing the MCM to be pulled away from the printed wiring board and removed, without weakening the bonding of the multiple layers of the laminate substrate or weakening the MCM component's bond to that substrate.

30 Claims, 7 Drawing Sheets

FIG. I

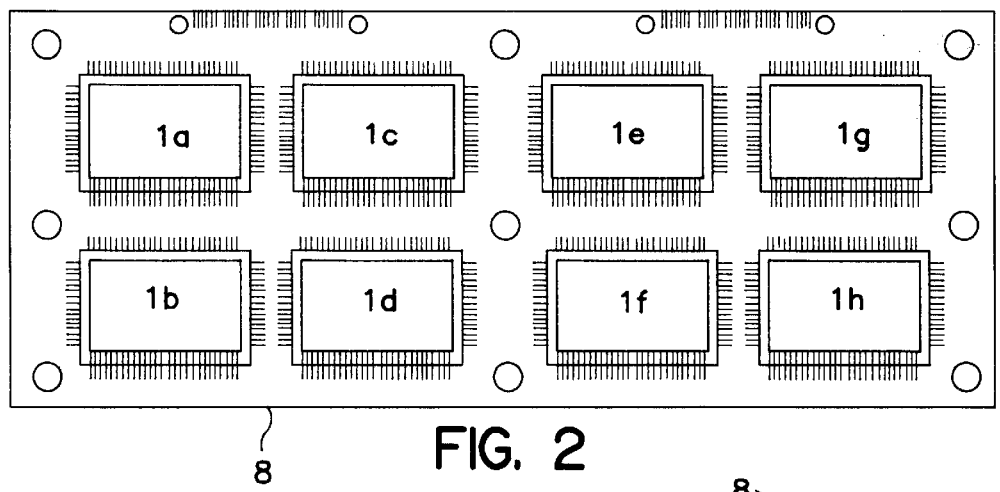
FIG. 2
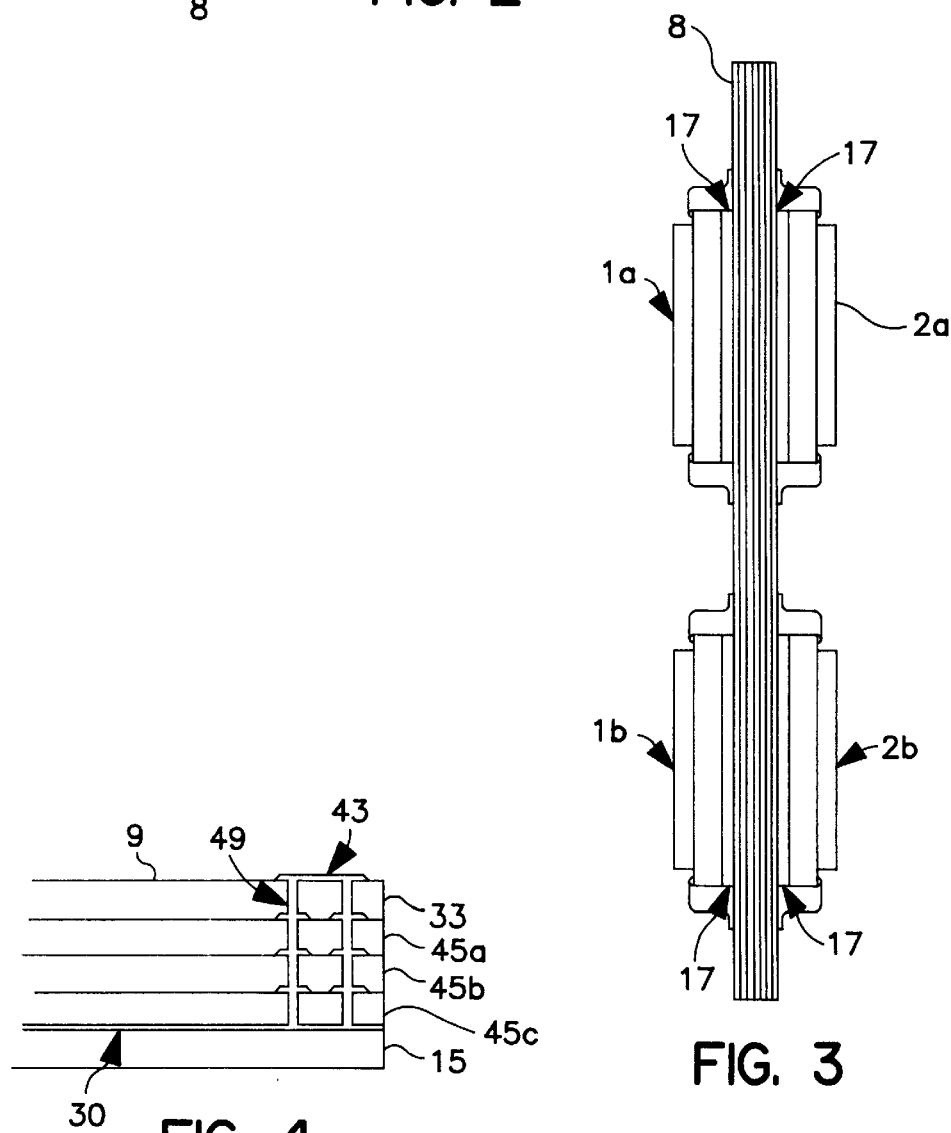
FIG. 3
FIG. 4

INTEGRAL HEATER FOR REWORKING MCMS AND OTHER SEMICONDUCTOR COMPONENTS

FIELD OF THE INVENTION

This invention relates to rework of electronic semiconductor components, including multi-chip modules ("MCMs"), in which the application of heat is a necessary element of the rework process, either to soften or weaken an attachment adhesive, such as found in the thermoset adhesive lead type components, or to reflow solder connections, such as found in ball grid array lead-less type components. By incorporating within the electronic semiconductor component's structure a feature that facilitates removal of that component from its installed adhesive-bonded position on a circuit board in the event of a semiconductor component failure, individual electronic semiconductor components may be expeditiously and efficiently removed and replaced. The invention avoids any necessity for discarding the entire circuit board, along with other good electronic components, avoiding the expensive procedure of building the entire circuit board assembly anew.

BACKGROUND

The most immediate application of the present invention is with Multi-Chip Modules, and that type of electronic semiconductor component is considered first. As is known, Multi-Chip Modules ("MCMs") perform a variety of electronic functions, and find ever increasing usage in sophisticated electronic applications, particularly airborne and spaceborne. By definition, an MCM contains two or more semiconductor die or chips, as variously termed, and ancillary electrical components, assembled in a single enclosed package, that together comprise an electronic circuit function. The semiconductor chips contain the micro-miniature integrated circuits, such as processors, amplifiers, memory, and the like. In one type of MCM structure, the semiconductor chips and components are supported on a common base, consisting of an integral multi-layer printed wiring structure, referred to as a "substrate". Often that substrate is formed of ceramic, an electrical insulator that is rigid, allows for plated-on conductors of the finest widths and spacing with the greatest accuracy and is able to maintain a hermetic seal. Metallic conductors printed on various layers of the substrate, and metallic vias through the layers, serve to electrically connect the semiconductor chips to each other and to the MCM's external interfaces.

Completing the module, the foregoing elements are contained together in a single enclosed package, often hermetically sealed, that serves as a protective housing for the semiconductor chips and associated components. The ceramic substrate, being hermetic, serves as the bottom wall to the module. A metal wall, or sealring, is brazed to the substrate around the perimeter, encompassing the components. A lid welded to the top surface of this sealring hermetically seals the components inside. A number of leads extend out the four sides of the module to provide external electrical input-output connections to the MCM.

The foregoing is a brief introduction to those known devices for the benefit of lay readers, and, for additional details of their construction, the interested reader may make reference to the technical literature.

In practice such MCMs are generally installed upon a larger circuit board which contains the electrical interconnections between the MCMs and other components thereon. This circuit board is typically constructed of a material such as glass-epoxy or glass-polyimide, a less expensive and less quality material than the ceramic.

For airborne and space applications, MCMs are typically bonded to the circuit boards. Bonding enhances thermal conductivity to the MCM, and isolates mechanical loads from the MCM's input-output connections, which promotes longer product life. Such bonding can be accomplished with a variety of adhesives, such as thermosetting epoxies or thermoplastics, and solder.

To bond the MCM in place, as example, a layer of thermally sensitive adhesive is applied to either the underside surface of the MCM, or directly to the surface of the circuit board at the location to which that component is to be placed. With the MCMs and all other components for that circuit board properly positioned, the board is then placed in an oven and the temperature raised to cure or reflow the adhesive, attaching the MCMs and other components in place. When removed from the oven and cooled down to room temperature the MCM's are firmly assembled to the circuit board.

If failed components are detected during subsequent electrical testing of the assembled board, they must be removed from the board for repair or replacement. This is traditionally accomplished by locally re-heating the adhesive with a stream of hot air from a heat gun or specialized nozzle, raising the temperature sufficiently to soften or weaken the adhesive bond, yet not to so high a temperature as to delaminate or damage the layers that form the circuit board or to cause damage to the component being removed. The component may then be easily twisted or pried off the surface, typically leaving residual amounts of adhesive which may be scrubbed or chemically cleaned from the circuit board's surface.

For small MCMs or other components, the forgoing detachment procedure is practical and commonly employed. However, for large MCMs or components, meaning those approximately 1.5 inches on a side or greater, the foregoing procedure proves inadequate.

Typical adhesives possess relatively low thermal conductivities. When heat is applied to one edge of a thin layer of such an adhesive at an elevated temperature and allowed to flow along the layer, one finds that, due to the material's low thermal conductivity, the temperature at different positions along the layer is significantly lower the farther the position is from the heated edge. Should one wish to raise the temperature at the center of that adhesive layer to a prescribed temperature, the temperature of the heated edge must be raised to a much higher level to compensate for the temperature drop along the thermal path through the adhesive to that center region of the adhesive layer.

Because of that high resistance heat path from the peripheral edges of the MCM or other large component to the central region of the bonding adhesive, adequate temperature elevation is difficult to achieve in the central region without driving outer portions of the MCM and circuit board to prohibitively high temperatures. Compounding that difficulty is the fact that the circuit board itself is an effective heat sink.

Circuit boards are designed to efficiently draw heat away from MCMs and other components during normal operation by use of such means as thermal vias and planar metalization patterns. Thus a circuit board also effectively draws heat away from an MCM or other component, and its underlying adhesive during the detachment process. Depending on the size of the MCM or other component, and the efficiency of the circuit board's thermal features, it may in fact be impossible to drive sufficient heat into the adhesive bondline at its perimeter to raise the temperature at its center to a sufficient temperature for removal.

Directing hot air at the top of the MCM instead, to drive heat vertically down through the MCM, is not a viable alternative. Since the module's substrate is separated from the module's cover by a space filled with an inert sealing gas, inherently a thermal insulator, that alternative heat path possesses an even greater thermal resistance than that from the edges.

Pulling or shearing the MCM off of the circuit board without adequate heating in the central region creates large physical stresses in both the MCM and the circuit board. Because of these high stresses, the MCM is often destroyed during removal. Since MCMs contain multiple integrated circuits, it is generally cost effective to rework a failed MCM by removing and replacing the one failed semiconductor die or other component within the MCM, rather than discarding and replacing the entire MCM. Thus it is desirable to detach a failed MCM from its circuit board intact, such that it can be repaired and returned to the circuit board. Furthermore, the high stresses caused by pulling an MCM from the circuit board without adequate heating also places the circuit board at risk of damage. If the board itself is damaged, the entire assembly must be discarded, at great cost.

Solder is another known thermally sensitive "adhesive" material used to fasten parts together. A second known technique for fastening the MCM to the circuit board is the solder ball grid array. Instead of incorporating electrical leads extending from the side of the MCM package and using a separate adhesive for fastening the MCM to the circuit board, as in the foregoing structure, the electrical leads are instead formed by electrical vias extending through the multiple layers of substrate to the underside surface of the MCM package. At the underside the terminal end of those vias typically appear by design arranged in regular rows and columns. Minute solder balls or solder columns, different geometries for the dab of solder collectively referred to herein as solder balls, are formed at the terminal ends of those vias on the underside of the substrate.

The MCM package is placed upon the circuit board, the latter of which contains solder pads that mate with the solder balls on the MCM package and the temperature is raised above the solder eutectic at which the solder reflows. When cooled, the solder solidifies and provides a firm mechanical connection that fastens the MCM package to the circuit board as well as completing the electrical connections to printed circuitry on the circuit board. The foregoing connection apparatus and technique is well known.

For removal of that solder ball grid array package from the circuit board is by the same described rework technique for the adhesively fastened MCM's. That is, sufficient heat is applied to the soldered connections to reflow, that is, liquify, the solder. And the same difficulty is evident where the MCM package is of a large size making it difficult to apply sufficient heat to the central region of the underside of the MCM package. The present invention also resolves that difficulty.

The foregoing need for rework in MCM's was earlier recognized and addressed in U.S. Pat. No. 5,624,750, granted April 1997 to Martinez et al, entitled "Adhesive Heater and Method for Securing an Object to a Surface", hereafter referred to as the "Martinez patent". The Martinez patent proposed the installation of a triple-layer laminate in between the MCM and the circuit board, in which the two outer layers comprised a thermoplastic adhesive, encapsulating an electrical heater element as the intermediate layer. The heater element therein is a resistive metal foil formed into a single serpentine pattern.

To mount the MCM to the circuit board, electrical current heated and softened the thermoplastic layers, and, with pressure simultaneously applied to the top of the MCM as one would do with a thermoplastic material, when the thermoplastic material cured, the MCM was adhesively secured in place to the PWB. The heater was left sandwiched in the adhesive, with its terminals exposed.

According to the Martinez patent, when it became necessary to remove the MCM from the circuit board for rework, a current was reapplied to the heater, and the heat thereby generated uniformly across the adhesive interface was sufficient to soften the adhesive bond holding the MCM in place. The MCM and heater would then be removed without damage to the circuit board or adjacent components. A repaired or replacement MCM could then be secured back into the original position by a like arrangement.

Although the Martinez patent's solution is interesting, upon consideration one recognizes that the resulting assembly process is more cumbersome than standard processes, and leaves extra elements in the assembly which are unnecessary during normal operation.

Also, the layered adhesive sandwich in the Martinez solution may also be thicker than the traditional adhesive bond joint, and this thickness represents additional thermal resistance between the MCM and circuit board during normal operation, resulting in higher operating temperatures for the chips within the MCM, and ultimately lower reliability or shorter product life.

Furthermore, this embedded foil heater described in the Martinez patent precludes the use of metal-filled adhesives. Adhesives loaded with metallic particles, generally silver, are commonly used to attach MCMs or other components with high operational power dissipations to a circuit board, because silver particles significantly improve the thermal conductivity of the adhesive, thus lowering the operating temperatures of these high power dissipation components. Metallic-filled adhesives are also used when it is necessary to establish an electrically conductive path from the back side of an MCM or other component to the circuit board, as is sometimes required for proper electrical operation.

An embedded foil heater would be incompatible with a metal-filled adhesive, as the conductive particles would short circuit the serpentine pattern and make it unsuitable as a heater element. Martinez's approach would also appear incompatible with a solder ball grid array, which the Martinez patent does not address. The structure proposed by the Martinez patent is not known to applicants to be in industrial practice and evident disabilities in that structure may be a reason why.

Like the structure in the Martinez patent, the present invention also makes use of an electrical heater to solve the problem of detaching an MCM for rework. However, as an advantage, the invention does not add extra elements to the traditional circuit board assembly process, does not significantly increase the thermal resistance of the path from the integrated circuits within the MCM to the circuit board and its accompanying heat sink, and does not preclude the use of thermally and electrically conductive metal-filled adhesives.

The problem in reworking MCM's, whether fastened to the circuit board by regular adhesives or with a solder ball grid array, is recognized as endemic to other large size electronic semiconductor components as well, even those that contain only a single physically large semiconductor chip. As those skilled in the art recognize, the more modern semiconductor chips are growing in physical size as more and more circuit functions are expected to be packed within a single die even in commercial devices, such as cellular telephones. As a consequence large numbers of very fine closely spaced wires are required to interface to the semiconductor die. Because the wires must all extend into the die they are necessarily physically small in width and must be packed closely together, typically one mil in diameter separated by a two mil space. However, conventional printed circuit board technology typically provides semiconductor die interface connections with no less than a four mil separation.

To resolve the apparent physical incompatibility in spacing requirements, the approach taken has been to mount the semiconductor chip onto an intermediate "interposer" substrate, which is often formed of ceramic material. The printed wiring formed on the substrate fans out from the microscopic spacings at the location of the semiconductor die or chip to the wider spacings and wider wiring required by the conventional printed circuit board.

That electronic semiconductor assembly is then mounted onto the printed circuit board. The electrical leads from the assembly's substrate are soldered to the mating solder pads on the printed circuit board, or, should the substrate instead employ a solder ball grid array, the solder balls are soldered to the mating solder pads formed on the printed circuit board. As in the case of the earlier described MCM's, in the foregoing arrangement, viewed in a generic sense, one multi-layer printed circuit board is mounted atop another printed circuit board.

The dimension critical wire bonding of the chip's electrical leads, thus, is accomplished on the ceramic substrate. Interconnect to the printed circuit board is accomplished by soldering the electrical leads from the substrate to mating pads on the conventional circuit board. With such an interposer or intermediate substrate, in retrospect, one recognizes the parallel between the foregoing structure and that of the MCM, earlier described.

Accordingly, an object of the present invention is to improve the process of reworking MCM's and other electronic semiconductor components.

A further object of the invention is to provide an improved structure for MCM's and other electronic semiconductor components that assists in detaching such MCM's or other electronic semiconductor components from its assembled position upon a circuit board when required for rework.

And a still further object of the invention is to structurally modify an MCM or other electronic semiconductor component to render it more easily removable from the surface of a circuit board for rework, without requiring the use of prohibitively high temperatures and without damaging the MCM or other component being detached, or other MCMs and components on the circuit board, or the circuit board itself.

SUMMARY OF THE INVENTION

In accordance with the foregoing objects and advantages, the improved MCM is characterized by an electrical heater element formed in a metallized pattern typically printed on the bottom most internal layer of the MCM's multi-layer substrate. In addition to the multiple layers of the multi-layer substrate containing the printed-on metal interconnections for the MCM's semiconductors and input-output connections, a dedicated bottom layer contains a number of printed and fired-on conductors, suitably arranged in a resistive pattern such as a serpentine, to cover the layer's surface. Electrical connection to this pattern is made through vias through the intermediate layers, to pads accessible on the top surface.

As a preferred feature and further advantage, the electrical conductors and supporting layer forming the heater are formed of the same conductor and substrate materials used in the other layers of the substrate, such as, respectively, aluminum oxide and tungsten, thereby permitting convenient manufacture as part of a conventional substrate fabrication process.

The foregoing and additional objects and advantages of the invention together with the structure characteristic thereof, which was briefly summarized in the foregoing passages, becomes more apparent to those skilled in the art upon reading the detailed description of the preferred embodiment, which follows in this specification, taken together with the illustration thereof presented in the accompanying drawings.

BRIEF DESCRIPTION OF THE DRAWINGS

In the drawings:

FIG. 2 is a top view of a circuit board containing a number of the MCMs of FIG. 1;

FIG. 3 is a side view of the circuit board assembly of FIG. 2;

FIG. 4 is an enlarged partial side view of the MCM substrate;

DESCRIPTION OF THE PREFERRED EMBODIMENTS

Figure 1:
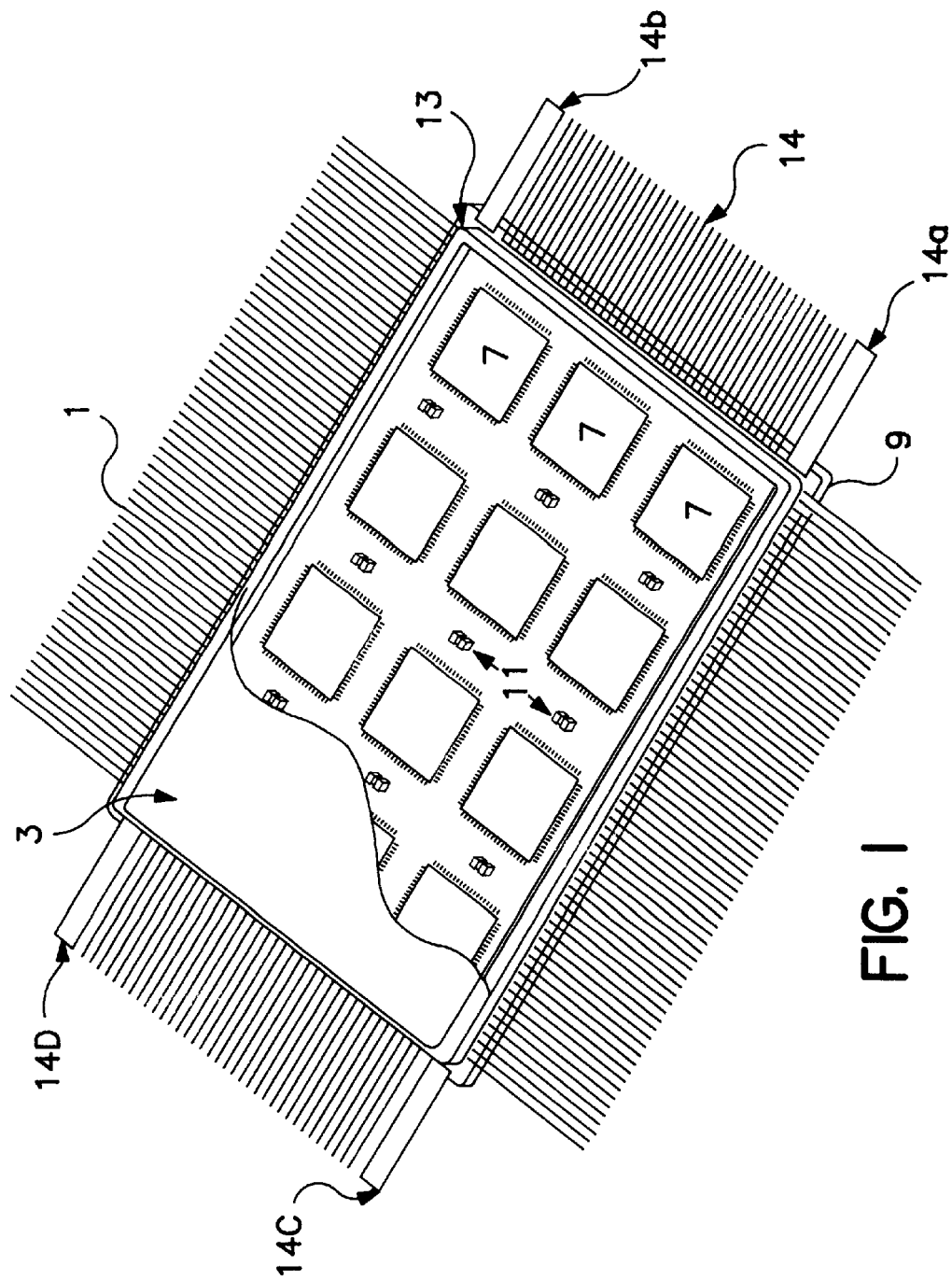
FIG. 1 is a perspective view of an MCM that incorporates the invention.

Reference is made to FIG. 1, which illustrate one example of a Multi-chip Module (MCM) 1 in a top perspective view, with the module lid 3 partially cut away. A plurality of semiconductor dice or chips 7, only three of which are labeled, are mounted at various locations upon a dielectric substrate 9, and a plurality of small electrical components 11, only two of which are labeled, are also mounted to the substrate 9. The chips are not encased; and the various junctions and metal traces exposed on the top surface of the semiconductor chips are very small in relative size and are not readily visible, nor illustrated in the figure.

A wall or ring 13 of metal or ceramic material borders the periphery of substrate 9, and is bonded in place, suitably by brazing. The wall serves to raise the lid 3 above the level of the confined semiconductor chips 7. A large number of metal traces printed on and in the substrate 9, not illustrated, define various power and signal paths, that interconnect the various semiconductor chips 7 within the module and/or provide electrical connections therefrom to the module's external leads 14, extending in rows from the module's four sides.

As those skilled in the art appreciate, the foregoing MCM in the view is of the same appearance as a prior art MCM containing the same electronic circuit function, since, with one possible exception hereafter described, the physical differences brought about through incorporation of the invention is not visible in this view.

It is appreciated that the present invention is not directed to any particular electronic circuit, or semiconductor package. Hence any illustration or description of the details of any such electronic circuit or package would only serve to introduce unnecessary complexity to the present description and would not aid one to understand the invention. Accordingly, other than to note the presence of such elements in a practical module, such elements are neither illustrated or described in detail.

One approach for applying power to the embedded heater is illustrated in FIG. 1. Leads 14a and 14b on ends of the row of leads on the right side of the figure, and leads 14c and 14d on the ends of the rows on the left side, are provided exclusively for the heater circuit. The foregoing leads are illustrated as being wider than the other leads in the respective rows. The wider leads, as is known, are capable of carrying greater levels of current than the more narrow leads, and are required to conduct the relatively large current required by the internal heater. Alternatively, one might instead use a number of the more narrow leads, connected in parallel, to carry the current; or one may omit the leads dedicated to the heater entirely, and make connection to the heater circuit by soldering wires directly to the top surface pads only when necessary to utilize the heater circuit.

For operation, the MCM is fastened to a larger circuit board, and which, along with other MCMs and components, together form a larger electronic system. Such an assembly is pictorially represented in FIG. 2, wherein eight such MCMs 1a through 1h are secured to one side of a circuit board 8, As represented in a side view in FIG. 3, circuit boards 8 may contain like numbers of MCMs on its opposite surface as well, such MCMs 2a and 2b.

As is the conventional practice for MCMs, the MCM's bottom surface is bonded to the circuit board 8. Bonding may be accomplished with a thermoset or thermoplastic adhesive, as represented at 17 in FIG. 3, or with solder in the case of a Ball-Grid Array (BGA). A metal filled adhesive may be preferred for thermal or electrical reasons.

An enlarged not-to-scale partial section of substrate 9 in example MCM 1 is presented in FIG. 4 to which reference is made. The substrate is a laminate containing multiple layers formed of a dielectric material, such as aluminum oxide, aluminum nitride or beryllium oxide, including a bottom most layer 15, an upper most layer 33, and one or more intermediate layers 45a, 45b and 45c. As later herein described, a plurality of electrical vias 49 extend through the multiple layers of the substrate to form a part of the electrical path between contacts 43 on the upper surface and conductors on lower layers 45 and 15. Additional metal vias may be included there between whose sole function is to conduct heat from the semiconductor die.

Figure 5:
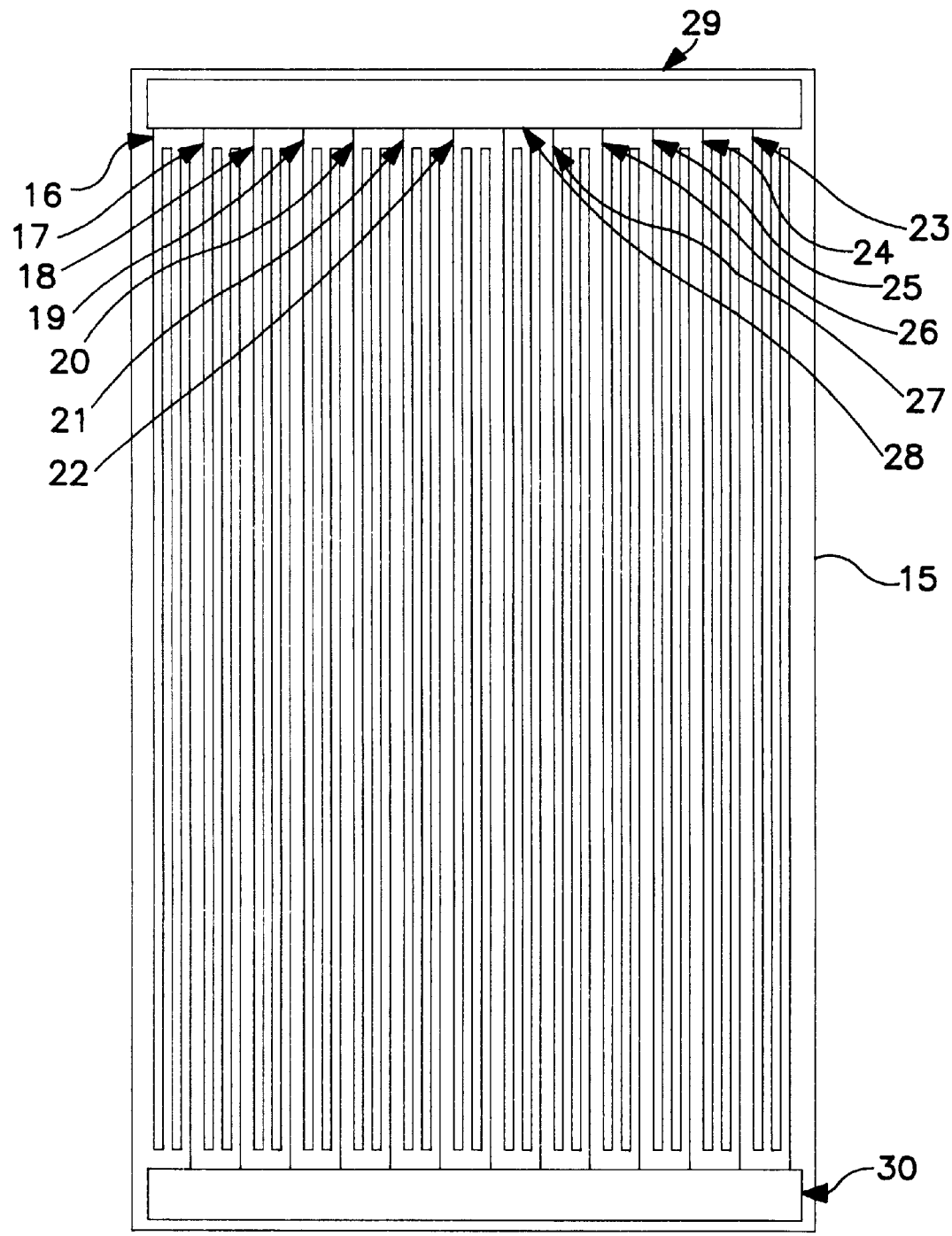
FIG. 5 is a top view of the bottom most internal layer of the MCM substrate used in the MCM of FIG. 1, showing the conductive heater pattern.

Reference is made to FIG. 5, which is a layout of the bottom most internal conductor pattern, printed on bottom layer 15 of substrate 9. In this layout, a plurality of printed-on conductors 16 through 28, each of which is arranged, in this example, in a wide serpentine pattern of two and one-half loops between the upper and lower side edges of the layer. One end of each of those conductors is attached to a wide straight printed-on conductor 29 that extends along the upper edge of the layer, placing those ends electrically in common. The opposite ends of those conductors are attached to a second wide straight printed-on metal conductor 30 that extends along the lower edge of the layer, placing the opposite ends of all the conductors electrically in common. The plurality of printed-on serpentine conductors is thus seen to collectively define one larger electrical heater.

It should be noted that although the foregoing layout is sufficient for producing the necessary electrical resistance, numerous other conductor layouts are possible, including brickwork-like grid patterns, which would also produce a suitable electrical resistance.

In one conventional type of MCM substrate construction, known as High Temperature Cofired Ceramic (HTCC), refractory metals such as tungsten are used as the main constituent of the ink which is printed-on to form the "printed conductors", the conductive traces for the interconnections on each of the substrate layers. Tungsten is compatible with the high firing temperatures inherent in substrate fabrication. These refractory metal conductors naturally lend themselves to the formation of heating element structures and do not require any special materials or process changes in the standard HTCC substrate fabrication technique. Moreover, the resistivity of the conductor metallization is such that practical resistances for heater elements can be tailored through simple geometrical manipulation of the artwork pattern used to form the heater element.

This same approach for incorporating the heater element is applicable to any HTCC component substrate, for instance, certain types of single-chip Quad-Flat Pack or Ball Grid Array packages. Embedding equivalent heaters in non-HTCC type components is possible, as later herein discussed, but, for practical reasons those structures may require the incorporation of additional materials or processes outside the normal fabrication procedure.

When the opposite polarity terminals of a DC source or the terminals of an AC source are connected between the ends of those heater conductors, current flows from the source through the resistive wiring or, as variously termed, metalization pattern, producing $I^2R$ losses in the refractory metal Tungsten, which generates heat. The heat generated flows by conduction through the thickness of the material in the bottom substrate layer 15, through the bonding material 17, and into circuit board 8.

Even though refractory metals such as tungsten are used for the other metal traces on the substrate, it should be appreciated that the current passing through the heater section during its operation is many orders of magnitude larger than the minute current that normally flows in the other metal traces on and in the substrate during normal operation of the semiconductors and those circuits, and the heat generated by those other metal traces is insignificant in comparison.

Figure 6:
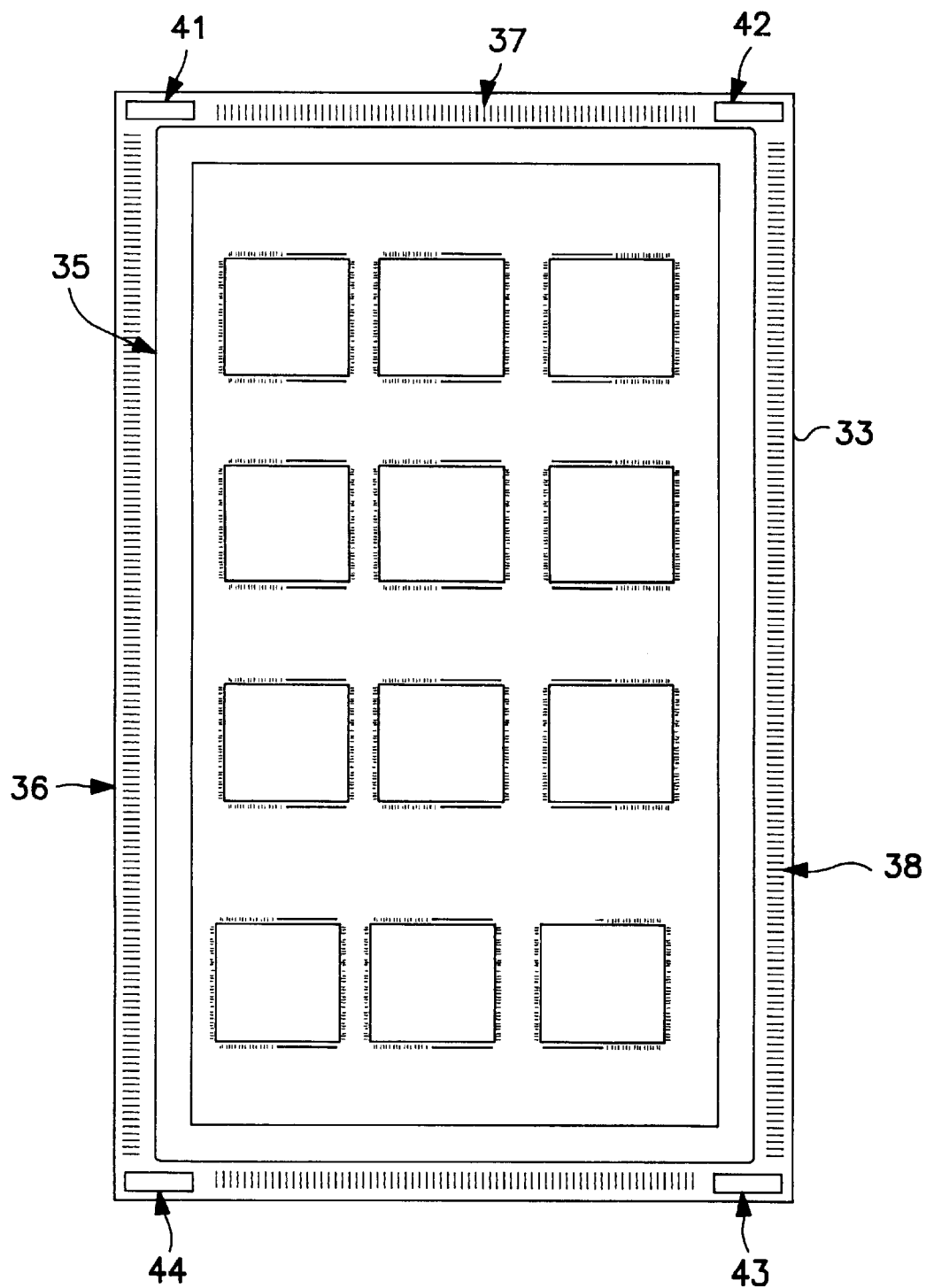
FIG. 6 is a top view of the top most layer of the MCM substrate used in the MCM of FIG. 1, showing a typical layout of conductors.

FIG. 6 offers a layout view of the surface of upper most layer 33 of substrate 9, illustrating the conductor layout. The wide rectangular frame or loop 35 is recognized as the metalized pad onto which the sealring 13, illustrated in FIG. 1., is brazed in typical practice. A plurality of metalized pads 36, 37, 38, and 39 evenly spaced in rows on the top, bottom, left and right sides, are recognized as the pads onto which the leads 14, illustrated in FIG. 1, are bonded or brazed. Four larger metallized pads or conductors 41, 42, 43 and 44 are located at each of the four corners, extending along the upper and lower edges of the layer. These conductors serve as the contacts or terminals for the electrical heater illustrated in FIG. 5.

Figure 7:
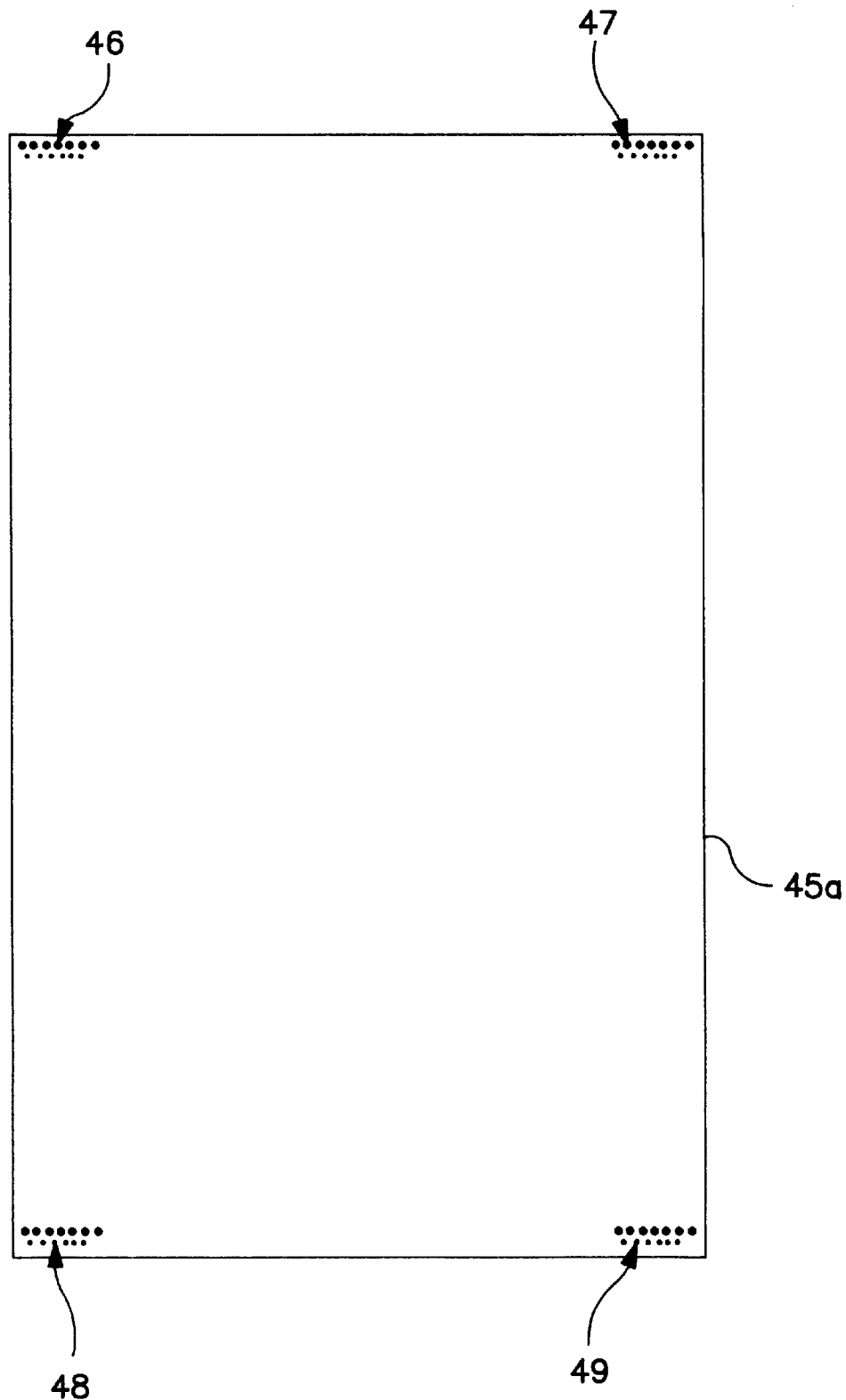
FIG. 7 is a top view of an intermediate layer of the MCM substrate containing electrical vias which interconnect the heater pattern of FIG. 5 to the surface conductor layer of FIG. 6.

FIG. 7 partially illustrates a layout of an intermediate layer 45*a* of substrate 9, intermediate to the upper most and bottom most layers. The sets of small dots 46–49 at the four corners represent electrical vias that extend through the layer. These electrical vias connect each of the conductors 41–44 to the heater metalization pattern upon bottom layer 33. A like set of conductive dots is present in the additional intermediate substrate layers 45*b* and 45*c*. Many more like vias, not illustrated, would also be present across the layer, which serve to interconnect other pads on the surface with conductor lines printed on the intermediate layer, also not illustrated. These latter vias and printed-on lines comprise the various power and signal paths for the normal MCM circuit operation, and, being unique to the particular circuit application of the MCM and not necessary to an understanding of the invention, are not illustrated or described in detail.

The plurality of vias clustered at each corner of the layer in FIG. 7, extending to the heater circuit on bottom layer 15, are necessary to carry the required current level, which would be orders of magnitude greater than that carried by a typical power or signal via in normal circuit operation.

Should the substrate 9 contain more than the three layers illustrated in the laminate, each additional intermediate layer would contain a like structure of vias 46–49, to extend the electrical connection between the surface pads and the heater circuit on the bottom layer 15 through those additional layers.

In assembling the semiconductor die to the substrate during manufacture of the MCM 1, the die or chip is attached to the substrate using a thermally stable microelectronics adhesive. In the inert-gas environment typical of a hermetic package, such adhesives remain stable to temperatures in excess of 200° C. On the other hand, many commercially available thermoplastic and thermosetting adhesives used for attaching components to circuit boards have glass-transition temperatures (i.e., softening temperatures) well below 200° C. The latter temperatures are readily attainable through use of the described MCM heater. Once above its glass-transition temperature (Tg), the adhesive securing the MCM or like component to the circuit board will yield under mechanical load and the removal of the MCM from the circuit board proceeds readily. No load is applied to the adhesive used to secure the die or dice to the substrate, and while this adhesive may soften at the removal temperature, it will harden upon removing the heat source from the MCM.

Typical component removal temperatures, less than 200° C., also have no damaging effect on the substrate construction itself, as typical Multi-Chip and single-chip module substrates are fabricated from ceramic materials which have been laminated and sintered together at temperatures in excess of 1000° C., forming a monolithic structure impervious to moderately elevated rework temperatures.

For rework of the foregoing MCM, one polarity of the source of current, not illustrated, is connected to the leads 14*a* and 14*b* in the MCM illustrated in FIG. 1; and the opposite polarity source is connected to leads 14*c* and 14*d*. Current flows into the MCM, into contacts 41 and 42, illustrated in FIG. 6, and from those, down through the vertically extending electrical vias, including vias 46 and 47, through the multiple intermediate layers of substrate 9, to one end of the heater metalization pattern on the bottom most substrate layer, and across the pattern. From there the current flows through the vertically extending vias, including vias 48 and 49, on the opposite side of the intermediate layers, up to contacts 43 and 44 on the upper surface of the substrate, FIG. 6. From the latter contacts the current flows in parallel out leads 14*c* and 14*d*, and back to the opposite polarity terminal of the current source. As an alternative construction, the heater-dedicated leads 14*a*–14*d* may be omitted, in which case an electrical circuit would be completed by soldering, clipping, or conductive-adhesive attaching discrete wires from the current source to the substrate heater contacts 41–44.

The refractory metal traces, being resistive in character, produce an $I^2R$ loss, generating heat. That heat passes through the bottom layer and into the adhesive material bonding the substrate 9 to the circuit board 8. The circuit board ultimately conducts the heat away from the adhesive to the environment.

In a practical embodiment such as illustrated, the resistance of the heater may be approximately 1 ohm. Then with reasonable voltage and current levels of 20 volts and 20 amps, respectively, 400 watts of thermal energy can thus be generated uniformly over the bottom surface. This would be sufficient to elevate an adhesive to a temperature suitable to weaken the adhesive used to bond the MCM to the circuit board.

In a test of a practical embodiment constructed in accordance with FIG. 1, an MCM was installed in place on a circuit board of polyimide glass construction using a silver-filled epoxy paste, Ablebond brand No. 967-1. The Tg was approximately 155 degrees C. The adhesive bond thickness was set at 0.010 inch across the entire MCM bond surface. The heater resistance was about 1.4 ohms.

Figure 8:
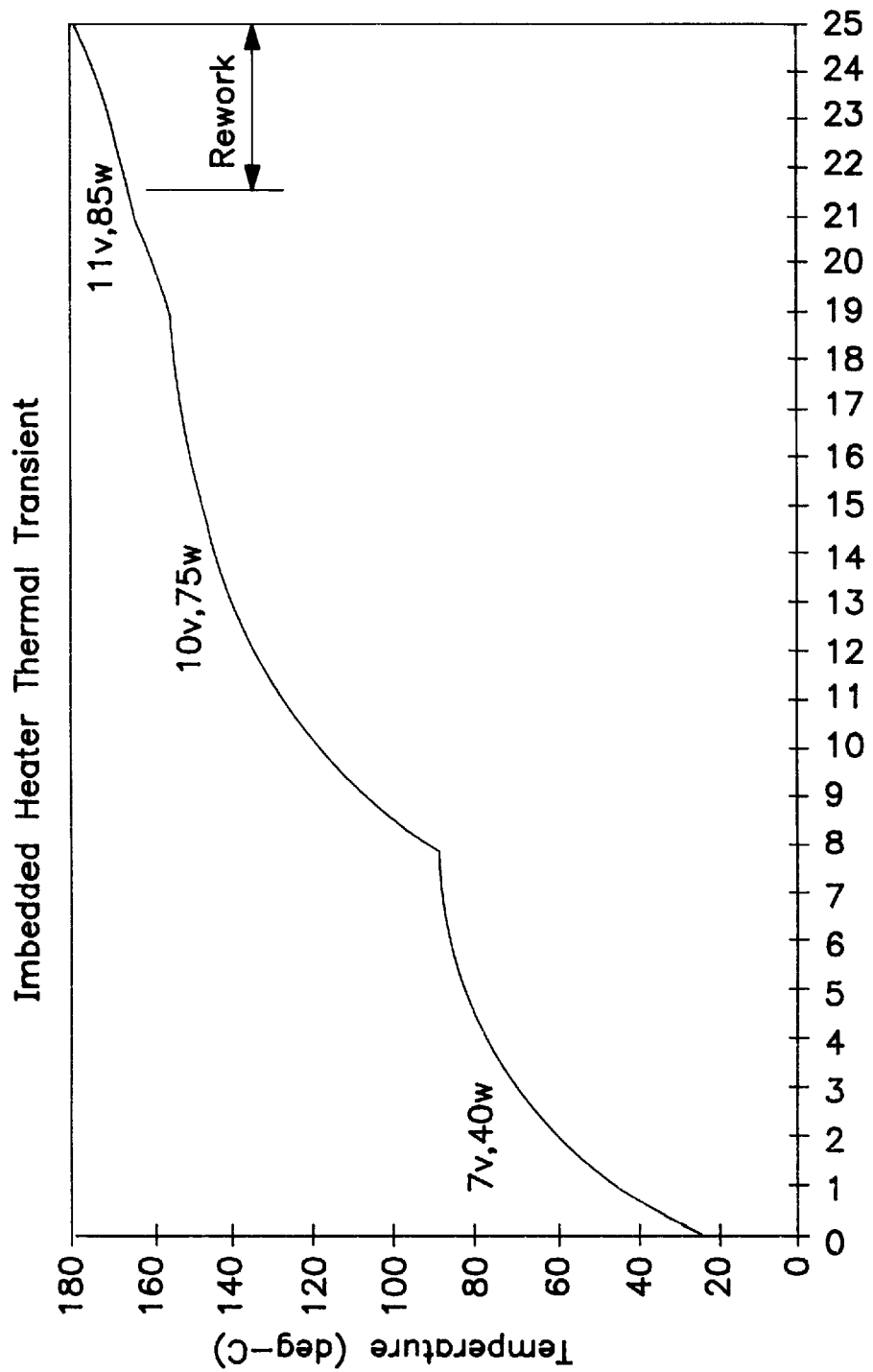
FIG. 8 is a graph depicting the temperatures attained in a practical embodiment constructed in accordance with the embodiment of FIG. 1.

A source of AC power was applied to the heater terminals and the voltage initially was set at 7.0 volts, developing approximately 40 watts in the heater. After about nine minutes elapsed the temperature attained was about 95 degrees C. When the voltage was increased to about 10.0 volts, developing about 75 watts in the heater, the temperature approached about 160 degrees C after a like lapse of time. Increasing the voltage to 11.0 volts to develop about 85 watts of power a temperature of 160 degrees C was attained. These results are graphically depicted in FIG. 8.

Starting to pull the MCM away from the printed wiring board when the temperature attained about 160 degrees C, it is found that the temperature continues to rise as the bond line between the MCM and circuit board releases in stages. It was found that the adhesive adhered to the MCM and cleanly peeled away from the gold plated regions of the MCM, and that some areas of the solder mask were also removed. Electrical power to the heater was terminated when the temperature attained 180 degrees C, avoiding the possibility of attaining higher temperatures that could attain the 200 degree C temperature at which the circuit board would be adversely affected.

Once the MCM or like component is detached from the circuit board, any residual adhesive may be removed from the board using chemical or mechanical means.

The foregoing embodiment of the invention has been described primarily in terms of MCMs and thermoset or thermoplastic adhesive. Nothing in the design precludes the use of the invention with other types of adhesives and/or other electronic components and such is understood to be within the scope of the present invention. The foregoing emphasis on MCMs and epoxy merely illustrates one preferred embodiment of the invention and its application.

As those skilled in the art may appreciate, the invention may be used with other thermally sensitive fastening materials, solder, as example. MCMs and other electronics components may be connected to a printed wiring board using an array of solder balls. Such Ball Grid Arrays ("BGAs"), well known in the electronics art, employ small solder spheres or, sometimes columns, as the mechanical and electrical connection between the board and the component, in lieu of extending electrical leads 14 employed in the embodiment of FIG. 1.

Figure 9:
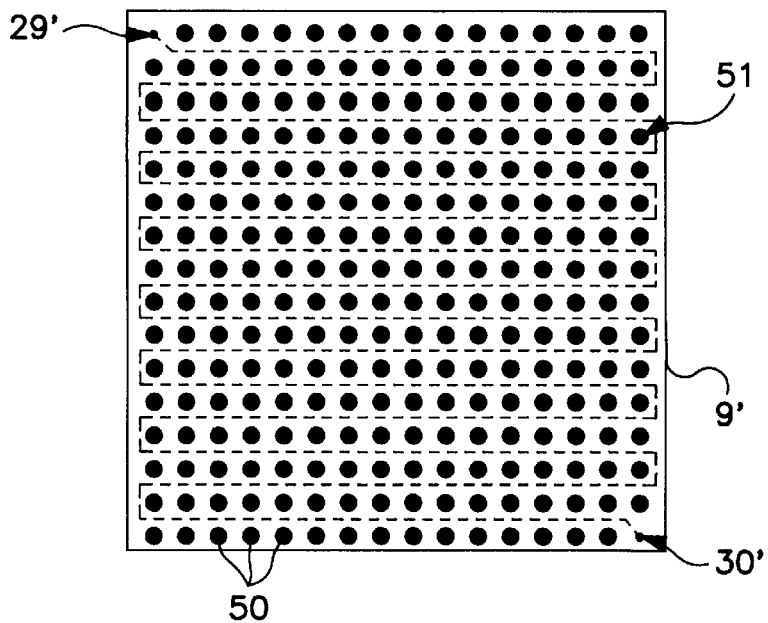
FIG. 9 is a bottom view of an alternative embodiment of the invention that employs a ball grid array.

As example, the illustration of FIG. 9, not drawn to scale, provides a bottom view of such an alternative embodiment of the MCM of FIG. 1, constructed using a BGA for the electrical and mechanical connections. For convenience the elements in this figure are denominated by the same number primed as was used to identify the corresponding element in the prior embodiment. In such an alternative structure, the bottom side of the bottom layer 15' of substrate 9' contains the solder balls 50, which are typically arranged in rows and columns. Those solder balls are attached to the ends of various electrical vias of conventional structure, not illustrated, that extend through the bottom substrate layer and one or more of the substrate's multiple layers to extend electrical paths to the appropriate electrical circuit and/or semiconductor chips affixed to the substrate's upper surface.

The printed conductor defining electrical heater 51 is located on the upper side of bottom layer 15' and is represented in dash lines. Heater 51 extends between the terminus 29' near one corner, following a zigzag path between adjacent rows and/or columns, to the terminus 30' near the opposite corner.

Figure 10:
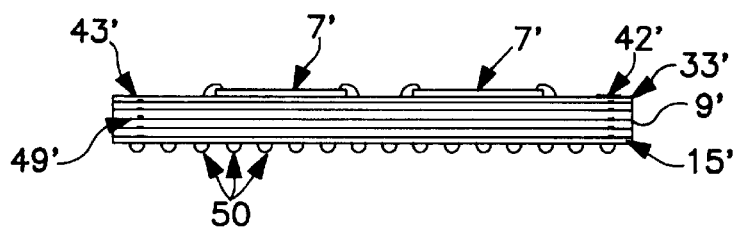
FIG. 10 is a side view of FIG. 9.
Figure 11:
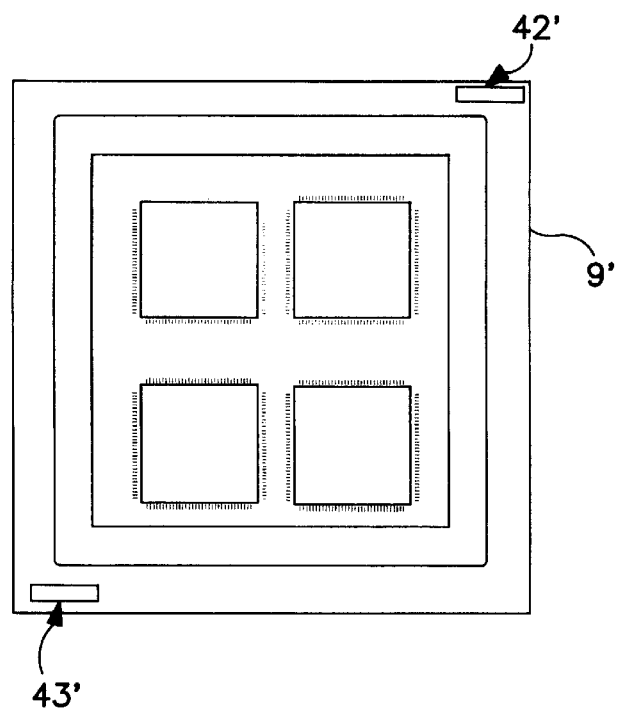
FIG. 11 is a top view of FIG. 9.

As illustrated in the side view of FIG. 10 and the top view of FIG. 11, to which reference is made, electrical vias 49' extend from pads 42' and 43' on the upper surface of top layer 33', through all intermediate layers of the substrate, to the respective termini 29' and 30' of the heater element on the upper surface of bottom layer 15'. Like the embodiment of FIG. 1, semiconductor chips 7' are attached to the upper surface of the top layer 33' of substrate 9' and the electrical interfaces from those chips are wire bonded to appropriate pads on the substrate's upper surface. Electrical paths between the various pads, and from the pads to the solder balls on the bottom of the substrate, are completed with metallic traces printed on the substrate's various internal layers, and with vias through the layers, as necessitated by the particular circuit function. The details of such conventional interconnect structure, not being necessary to an understanding of the invention, are not further described.

As illustrated in the side view of FIG. 10, to which reference is made, the semiconductor chips or dies 7' are attached to the upper surface of the top layer 33' of substrate 9' and the electrical leads from those dies or chips are wire bonded to appropriate solder pads, not illustrated, on the substrate's upper surface, the same as with the embodiment of FIG. 1. Through those solder pads various electrical paths are completed through and about the substrate and to the electrical vias that terminate at the various solder balls, as necessitated by the particular circuit functions for the semiconductor chips, the details of such conventional structure not being necessary to the understanding of the invention and are not be further described.

In typical application the spacing between the electrical vias underlying the solder balls of a row is about 10 to 20 mils; and that between rows, about 10 to 20 mils. That spacing leaves sufficient clearance for placement of printed wiring lines that define the electrical heater with those lines being about 5 to 10 mils in width.

In the foregoing BGA interconnection technique, solder paste is applied to the solder pads of the circuit board on which the BGA is to be installed. After positioning the balls of the BGA on top of the associated solder pads, the BGA is heated to melt the solder, which wets the adjoining surfaces. Upon cooling, the solder solidifies leaving a firm mechanical bond between the BGA and the circuit board and completes the electrical connections therebetween.

Should it become necessary to remove the BGA from its installed position on the printed wiring board, electrical current is applied through the heater windings, as was the case in the prior embodiment. Due to the resistance of the wiring, that current generates heat, which in turn flows through the bottomside of the substrate and into the solder. Raising the temperature beyond the eutectic temperature of the solder, solder melts and the BGA may be removed. The foregoing structure may also be used as a local heater to melt the solder of a like BGA during BGA replacement akin to the procedure used in the Martinez patent, U.S. Pat. No. 5,642,750, earlier cited in the background to the invention.

Substrates required by the present invention are fabricated using the same materials and processes as traditional multilayer multi-chip and single-chip modules. Vendors are not required to learn new processing techniques, obtain new production equipment, or handle unfamiliar materials, but retain the tried and true procedures. The final substrate is only slightly thicker than the prior MCM substrate, due to the single additional layer as the bottom layer.

Furthermore, although the invention improves large size MCMs, as those skilled in the art appreciate, the improved construction may also be applied to other MCMs and single-chip packages, such as referred to in the background to this specification, as well, so long as the printed wiring used in the chip substrate has an adequate lossy characteristic akin to that of Tungsten in the foregoing embodiments. Little is added to the design cost or to the manufacturing cost. In retrospect the invention offers a simple and cost efficient aid to electronic package rework procedures.

In those instances in which the wiring of the substrate is of a highly conductive and, hence, very low loss material, such as copper or gold, should the heaters be formed of the same material, even if the length of wire is quite large and the width very small, the $I^2R$ losses as would occur by applying power are likely insufficient to generate the required heat and temperatures needed. In that event it is not possible to obtain the full economic benefit of the invention. It is then necessary to form the heater wiring on the substrate using a different material, such as Tungsten, in place of the copper, in the bottom layer of the substrate. The manufacturer then would use different technology for fabricating the bottom most substrate layer than is used for the other layers in the multi-layer substrate.

It is believed that the foregoing description of the preferred embodiments of the invention is sufficient in detail to enable one skilled in the art to make and use the invention. However, it is expressly understood that the detail of the elements presented for the foregoing purpose is not intended to limit the scope of the invention, in as much as equivalents to those elements and other modifications thereof, all of which come within the scope of the invention, will become apparent to those skilled in the art upon reading this specification. Thus the invention is to be broadly construed within the full scope of the appended claims.

What is claimed is:

1. In a multi-chip module, said module comprising a plurality of semiconductor chips, a multi-layer substrate of a high temperature co-fired ceramic for supporting said semiconductor chips, said multi-layer substrate containing electrical connections for connection to said plurality of semiconductor chips and for connection to an external printed wiring board, the improvement wherein the upper surface of the lower most one of said multiple layers of said multi-layer substrate includes a plurality of resistive Tungsten metal traces defining a plurality of electrical heaters, said electrical heaters being positioned side by side.

2. In a electronic semiconductor component, said semiconductor component including a semiconductor chip, said semiconductor chip including a plurality of electrical interface leads, and a multi-layer substrate having a predetermined area for supporting said semiconductor chip on a printed circuit board, said multi-layer substrate having dimensions defining said predetermined area, said multi-layer substrate comprising layers of a predetermined material laminated together, said multi-layer substrate containing first electrical connections for connection to said electrical interface leads of said semiconductor chip and second electrical connections for electrical connection to predefined locations upon a printed circuit board, the improvement wherein the lower most layer of said multi-layer substrate comprises electrical heater means, said electrical heater means for producing heat uniformly over said predetermined area, said heat being sufficient to weaken said second electrical connections and being insufficient to delaminate layers of said multi-layer substrate from one another and being insufficient to weaken said first electrical connections.

3. The invention as defined in claim 1, wherein said electrical heater means comprises a plurality of resistive metal traces defining a plurality of electrical heaters, said electrical heaters being positioned side by side on an upper surface of said lower most layer.

4. The invention as defined in claim 3, wherein said multi-layer substrate comprises a ceramic material, wherein said resistive metal traces comprise Tungsten.

5. The invention as defined in claim 4, wherein said multi-layer substrate includes a plurality of electrical vias defining electrical paths through at least two layers of said multi-layer substrate.

6. The invention as defined in claim 5, wherein said second electrical connections comprise electrical leads.

7. The invention as defined in claim 5, wherein said second electrical connections comprise solder balls.

8. The invention as defined in claim 5, wherein said electrical vias extend at least through said lower most layer and through space between said resistive metal traces and terminate at an end located on the underside surface of said lower most layer; and wherein said second electrical connections comprise solder balls, each of said solder balls being attached to an end of a respective one of said ends of said electrical vias.

9. The invention as defined in claim 8, wherein said multi-layer substrate comprises at least four layers.

10. The invention as defined in claim 5, wherein said multi-layer substrate further comprises: heater terminals for connecting a source of electrical current to said heater means; said heater terminals being located on an upper surface of the upper layer of said multi-layer substrate; and a plurality of electrical vias extending from said heater terminals through multiple layers of said multi-layer substrate to said electrical heater means to place said electrical heater means in circuit with heater terminals.

11. The invention as defined in claim 1, wherein said multi-layer substrate further comprises: heater terminals for connecting a source of electrical current to said heater means; said heater terminals being located on an upper surface of the upper layer of said multi-layer substrate; and a plurality of electrical vias extending from said heater terminals through multiple layers of said multi-layer substrate to said electrical heater means to place said heater means in circuit with electrical heater terminals.

12. The invention as defined in claim 1, wherein said multi-layer substrate comprises at least four layers.

13. A large size multi-chip module for attachment to a printed wiring board by a first thermally sensitive adhesive, comprising:

a plurality of semiconductor chips;

a multi-layer substrate for supporting said semiconductor chips and defining a bottom surface to said multi-chip module;

said multi-layer substrate including:

an upper layer attached to said semiconductor chips and a bottom layer containing said bottom surface for attachment to said printed wiring board;

a second thermally sensitive adhesive attaching said upper layer of said substrate to said plurality of semiconductor chips;

said bottom layer of said multi-layer substrate including a top surface, a bottom surface and electrical heater means disposed on said top surface;

said electrical heater means being responsive to electrical current to produce heat to weaken said first thermally sensitive adhesive attachment between said bottom layer and said printed wiring board without weakening said second thermally sensitive adhesive attachment to said plurality of semiconductor chips, whereby said multi-chip module may be removed from said printed wiring board.

14. The invention as defined in claim 13, wherein said electrical heater means comprises:

a plurality of resistive metal traces painted on said top surface of said bottom layer of said multi-layer substrate, each said metal trace in said plurality of resistive metal traces defining an individual electrical heater, whereby said bottom layer includes a plurality of electrical heaters, said electrical heaters being positioned side by side on said top surface of said bottom layer of said multi-layer substrate.

15. The invention as defined in claim 14, wherein said resistive metal traces consist of the metal Tungsten.

16. The invention as defined in claim 14, wherein said upper layer of said multi-layer substrate includes first and second electrical pads for connecting an external source of electrical current to said electrical heater means; and a plurality of electrical vias extending from said first and second electrical pads to said heater means to place said heater means in circuit with said first and second electrical pads.

17. The invention as defined in claim 14, wherein said upper layer of said multi-layer substrate includes first and second electrical pads for connecting an external source of electrical current to said electrical heater means, said first and second electrical pads being located on opposite ends of said upper layer of said multi-layer substrate;

wherein each of said plurality of electrical heaters includes a first termini located at a near end of said bottom layer and a second termini located at the far end of said bottom layer; and further comprising:

a first conductor extending along said near end of said bottom layer connecting said first termini of said electrical heaters electrically in common with one another;

a second conductor extending along said far end of said bottom layer connecting said second termini of said electrical heaters electrically in common with one another; and wherein said multi-layer substrate further includes:
 a first plurality of electrical vias extending from said first conductor on said bottom layer to said first electrical pad;
 a second plurality of electrical vias from said second conductor on said bottom layer to said second electrical pad.

18. The invention as defined in claim 17, wherein each layer of said multi-layer substrate comprises aluminum oxide; and wherein said multi-layer module comprises an area of at least four square inches and in which a side dimension to said area is no smaller than two inches in length.

19. The invention as defined in claim 13, wherein said multi-layer substrate comprises the material aluminum oxide.

20. The invention as defined in claim 13, wherein said multi-layer substrate comprises any of the materials aluminum oxide, aluminum nitride and beryllium oxide.

21. The invention as defined in claim 13, wherein said multi-layer module comprises an area of at least four square inches and in which a side dimension to said area is no smaller than two inches in length.

22. A multi-chip module for attachment to a printed wiring board with a thermally sensitive material, comprising:
 a plurality of semiconductor chips;
 a multi-layer substrate for supporting said semiconductor chips and defining a bottom to said multi-chip module;
 said multi-layer substrate including:
  an upper layer attached to said semiconductor chips, said upper layer including electrical conductors; and
  a bottom layer, said bottom layer including top and bottom surfaces, said bottom surface of said bottom layer including a thermally sensitive material for attachment to said printed wiring board;
 a thermally sensitive adhesive for attaching said plurality of semiconductor chips to said first layer of said substrate; and
 said top surface of said bottom layer of said multi-layer substrate including electrical heater means;
 said electrical heater means being responsive to electrical current to produce heat to weaken said thermally sensitive material attachment between said bottom layer and said printed wiring board without weakening said thermally sensitive adhesive attachment between said multi-layer substrate and said plurality of semiconductor chips, whereby said multi-chip module may be removed from said printed wiring board.

23. The invention as defined in claim 22, wherein said thermally sensitive material comprises electrical solder, said solder having a eutectic temperature below the softening temperature of said thermally sensitive adhesive attachment.

24. The invention as defined in claim 22, wherein said thermally sensitive material comprises another thermally sensitive adhesive material, said another thermally sensitive adhesive material having a post-cure softening temperature higher than the post-cure softening temperature of said thermally sensitive adhesive material.

25. The invention as defined in claim 22, wherein each layer of said multi-layer substrate comprises Aluminum Oxide; wherein said electrical conductors comprises Tungsten; and wherein said heater comprises Tungsten.

26. The invention as defined in claim 22, wherein said thermally sensitive adhesive has a predetermined post-cure softening temperature; and wherein said thermally sensitive material comprises: electrical solder, said solder having a eutectic temperature below said predetermined post-cure softening temperature of said thermally sensitive adhesive.

27. The invention as defined in claim 22, wherein said thermally sensitive adhesive has a predetermined post-cure softening temperature wherein said thermally sensitive material comprises a second thermally sensitive adhesive material, said second thermally sensitive adhesive having a post-cure softening temperature that is lower than said post-cure softening temperature of said first mentioned thermally sensitive adhesive.

28. In a multi-chip module array, wherein a plurality of large size multi-chip modules are bonded by thermally sensitive adhesive to a printed wiring board, and wherein each of said multi-chip modules comprises a plurality of semiconductor chips mounted to a substrate, said substrate comprising a high temperature co-fired ceramic laminate of multiple layers of aluminum oxide material, including a bottom layer that serves as the underside surface of the multi-chip module to which said thermally sensitive adhesive attaches, and wherein at least one of said multiple layers in said laminate overlying said bottom layer includes conductive metal traces, the improvement wherein said bottom layer of each said substrate of said plurality of large size multi-chip modules further comprises a metal trace attached to a top surface of said bottom layer to define an electrical heater; wherein said upper surface of said upper layer of said multi-layer substrate includes first and second electrical pads for connecting an external source of electrical current to said electrical heater; and includes a plurality of electrical vias extending from said first and second electrical pads to said electrical heater to place said electrical heater in circuit with said first and second electrical pads.

29. The invention as defined in claim 28, wherein said electrical heater comprises at least one metal trace extending in a serpentine path over said bottom layer.

30. The invention as defined in claim 28, wherein said conductive metal traces and said metal trace attached to a top surface of said bottom layer comprise Tungsten.

* * * * *